(12) United States Patent
Hirai

(10) Patent No.: US 7,910,469 B2
(45) Date of Patent: Mar. 22, 2011

(54) ELECTRICAL CIRCUIT, THIN FILM TRANSISTOR, METHOD FOR MANUFACTURING ELECTRIC CIRCUIT AND METHOD FOR MANUFACTURING THIN FILM TRANSISTOR

(75) Inventor: Katsura Hirai, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 86 days.

(21) Appl. No.: 10/528,961

(22) PCT Filed: Sep. 24, 2003

(86) PCT No.: PCT/JP03/12140
§ 371 (c)(1),
(2), (4) Date: Mar. 22, 2005

(87) PCT Pub. No.: WO2004/030072
PCT Pub. Date: Apr. 8, 2004

(65) Prior Publication Data
US 2006/0006378 A1    Jan. 12, 2006

(30) Foreign Application Priority Data

Sep. 25, 2002   (JP) ................ 2002-278599

(51) Int. Cl.
*H01L 21/44* (2006.01)
(52) U.S. Cl. .............. 438/597; 438/601; 257/E21.533
(58) Field of Classification Search ......... 438/597–601; 257/E21.533
See application file for complete search history.

(56) References Cited

U.S. PATENT DOCUMENTS

| | | | | |
|---|---|---|---|---|
| 5,637,421 | A | * | 6/1997 | Poehler et al. ............. 429/303 |
| 5,641,559 | A | * | 6/1997 | Namiki ..................... 428/216 |
| 6,340,443 | B1 | * | 1/2002 | Kurihara et al. ............ 264/464 |
| 6,718,628 | B2 | * | 4/2004 | Munshi ...................... 29/825 |
| 6,767,731 | B2 | * | 7/2004 | Hannah ................... 435/287.2 |
| 6,905,906 | B2 | | 6/2005 | Sirringhaus et al. |
| 2001/0038910 | A1 | * | 11/2001 | MacQueen et al. ......... 428/327 |
| 2001/0044177 | A1 | * | 11/2001 | Fukushima et al. ......... 438/226 |
| 2002/0016440 | A1 | | 2/2002 | Louwet et al. |
| 2003/0068581 | A1 | * | 4/2003 | Kawamura et al. ......... 430/315 |
| 2003/0091609 | A1 | * | 5/2003 | Hendriks ................... 424/423 |
| 2003/0099874 | A1 | * | 5/2003 | Kim et al. .................. 429/33 |
| 2009/0171406 | A1 | * | 7/2009 | Foley et al. ................. 607/3 |

FOREIGN PATENT DOCUMENTS

| | | |
|---|---|---|
| EP | 930641 A2 | 7/1999 |
| EP | 1 081 549 A1 | 3/2001 |
| JP | 06271655 | 9/1994 |

(Continued)

OTHER PUBLICATIONS

Deleeuw, et al, Polymeric Integrated Circuits and Light-Emitting Diodes, Dec. 7-10, 1997, pp. 13.1-13.1-5, Philips Research Laboratories, The Netherlands.

*Primary Examiner* — Hoai V Pham
*Assistant Examiner* — Elias Ullah
(74) *Attorney, Agent, or Firm* — Holtz, Holtz, Goodman & Chick, P.C.

(57) ABSTRACT

An electrical circuit containing a substrate having thereon a receptive layer, wherein the receptive layer has a conductive polymer impregnated in the receptive layer, and a method for forming the electrical circuit.

23 Claims, 4 Drawing Sheets

FOREIGN PATENT DOCUMENTS

| | | |
|---|---|---|
| JP | 11274681 | 8/1999 |
| JP | 11-274681 A | 10/1999 |
| JP | 2000-193922 A | 7/2000 |
| JP | 2002-26014 A | 1/2002 |
| JP | 2002-164635 A | 6/2002 |
| JP | 2003-80694 A | 3/2003 |
| JP | 2003-318193 A | 11/2003 |
| JP | 2003-318401 A | 11/2003 |
| WO | WO 0147043 | 6/2001 |

\* cited by examiner

ELECTRICAL CIRCUIT, THIN FILM TRANSISTOR, METHOD FOR MANUFACTURING ELECTRIC CIRCUIT AND METHOD FOR MANUFACTURING THIN FILM TRANSISTOR

This application is a U.S. National Phase Application under 35 USC 371 of International Application PCT/JP2003/012140 filed Sep. 24, 2003.

TECHNICAL FIELD

The present invention relates to an electrical circuit and a production method of the same, as well as a thin film transistor and a production method of the same.

BACKGROUND OF THE INVENTION

Common methods for forming electrical circuit patterns on a substrate are such that after forming, on the entire surface of the substrate, a conductive film, an insulating film, a semiconductor film, and a dielectric film, employing vacuum processes such as sputtering, circuit patterning is performed employing photolithographic techniques. Photolithographic techniques, as described herein, refer to the method in which a photosensitive resist is applied onto the thin film to be subjected to patterning, and after being exposed via a photomask and developed, thin exposed film portions are subjected to dry etching or wet etching. Thereafter, commonly, the resist is peeled off and after forming a film of another material, the photolithographic process is repeated.

Recently, a method for directly forming a pattern without using a photolithographic method but using an ink-jet printing head has been tested. In this method, an ink containing a desired material for the electrical circuit is employed. By using such a method, it has become possible to simplify formation of circuit patterns.

In the above example of employing an ink-jet head, ejected ink spreads over a substrate, which prevents formation of highly resolutional patterns. Namely, it has been difficult to uniformly place an ink at a desired position on the substrate.

As a technique to overcome the problem in which the ink spreads over a substrate, for example, Japanese Patent Publication Open to Public Inspection (hereafter referred to as JP-A) No. 11-274681 discloses a technique in which an adsorbing layer for the solvent of the ink is provided on the substrate.

However, the above technique also has a problem in that the solute of the ink is not impregnated in the adsorbing layer resulting in forming an accumulation of patterning materials on the surface of the adsorbing layer, which is not suitable for manufacturing a complicated circuit pattern, for example, a three-dimensional circuit pattern.

Further, heretofore, in order to protect the accumulated ink solutes on the surface of the adsorbing layer, a protective layer has been provided. However, this method not only increases the number of work steps but also makes it difficult to use a polymer support which is suitably used for a flexible print circuit, as well as a flexible display.

Still further, WO 01/47043 discloses a technique in which by pattern formation via ejecting ink of an aqueous dispersion of conductive polymers, a source electrode and a drain electrode are formed, whereby a top gate type thin organic film transistor (an organic TFT) is prepared.

However, in this method, there have been a disadvantage that it takes time until the solution is dried and pattern formation is completed. In addition, patterning accuracy degrades due to spreading of liquid droplets. Further, since a polyimide film is employed to form a channel via photolithography, complicated process are required, resulting in further increase in the production cost.

SUMMARY OF THE INVENTION

In view of the foregoing problems, the present invention was achieved. An object of the present invention is to provide an electrical circuit as well as a thin film transistor capable of being simply and quickly formed without a thermal treatment, a method for simply and quickly forming an electrical circuit having a fine and complex circuit pattern, and a method for producing a thin film transistor.

The object of the present invention is achieved by the following structures.

(1) An electrical circuit containing a substrate having thereon a receptive layer, wherein the receptive layer has a conductive polymer impregnated in the receptive layer.

(2) The electrical circuit of claim (1), further containing a terminal made of an electrical conductor or a semiconductor on the substrate, the receptive layer being adjacent to the terminal, whereby the conductive polymer is electrically connected with the terminal so as to form at least a part of the electrical circuit.

(3) The electrical circuit of Item (1) or Item (2), wherein:
the conductive polymer is an oligomer having a repeat number of 4 to 19 or a polymer having a repeat number of 20 or more; and
the conductive polymer has a repeat unit of thiophene, vinylene, thienylene vinylene, phenylene vinylene, p-phenylene or substituent compounds thereof.

(4) The electrical circuit of Item (3), wherein the conductive polymer is an oligomer or a polymer having thiophene or substituted thiophene as the repeat unit.

(5) The electrical circuit of Item (3) or Item (4), wherein the oligomer or the polymer contains a dopant.

(6) The electrical circuit of any one of Items (1) to (5), wherein an electrical conductivity of the conductive polymer is 0.01 S/cm or more.

(7) The electrical circuit of Item (6), wherein the electrical conductivity of the conductive polymer is 1 S/cm or more.

(8) The electrical circuit of any one of Items (1) to (7), wherein the receptive layer is porous.

(9) The electrical circuit of Item (8), wherein the receptive layer contains inorganic particles.

(10) The electrical circuit of Item (9), wherein the inorganic particles are fumed silica particles.

(11) The electrical circuit of Item (9) or Item (10), wherein an average particle diameter of the inorganic particles is 0.003 to 0.2 μm.

(12) The electrical circuit of Item (11), wherein the average particle diameter of the inorganic particles is 0.005 to 0.1 μm.

(13) The electrical circuit of any one of Items (9) to (12), wherein:
the receptive layer further contains a hydrophilic binder; and
a weight ratio of the inorganic particles to the hydrophilic binder is between 2:1 and 20:1.

(14) The electrical circuit of any one of Items (1) to (13), wherein the substrate is a polymer.

(15) A thin film transistor containing a substrate having thereon:
a semiconductor layer;
a receptive layer adjacent to the semiconductor layer;

a gate electrode; and
a gate insulator layer provided:
between the receptive layer and the gate electrode; and
between the semiconductor layer and the gate electrode,
wherein the receptive layer comprises:
a source electrode made of a conductive polymer impregnated in the receptive layer; and
a drain electrode made of the conductive polymer impregnated in the receptive layer,
the source electrode and the drain electrode each being in contact with the semiconductor layer.

(16) The thin film transistor of Item (15),
wherein:
the conductive polymer is an oligomer having a repeat number of 4 to 19 or a polymer having a repeat number of 20 or more; and
the conductive polymer has a repeat unit of thiophene, vinylene, thienylene vinylene, phenylene vinylene, p-phenylene or substituent compounds thereof.

(17) The thin film transistor of Item (16), wherein the conductive polymer is an oligomer or a polymer having thiophene or substituted thiophene as a repeat unit.

(18) The thin film transistor of any one of Items (16) to (17), wherein the oligomer or the polymer contains a dopant.

(19) The thin film transistor of claim 16, wherein an electrical conductivity of the conductive polymer is 0.01 S/cm or more.

(20) The thin film transistor of Item (19), wherein the electrical conductivity of the conductive polymer is 1 S/cm or more.

(21) The thin film transistor of any one of Items (15) to (20), wherein the receptive layer is porous.

(22) The thin film transistor of Item (21), wherein the receptive layer contains inorganic particles.

(23) The thin film transistor of Item (22), wherein the inorganic particles are fumed silica particles.

(24) The thin film transistor of Item (22) or Item (23), wherein an average particle diameter of the inorganic particles is 0.003 to 0.2 μm.

(25) The thin film transistor of Item (24), wherein the average particle diameter of the inorganic particles is 0.005 to 0.1 μm.

(26) The thin film transistor of Item (22) or Item (25), wherein:
the receptive layer further contains a hydrophilic binder; and
a weight ratio of the inorganic particles to the hydrophilic binder is between 2:1 and 20:1.

(27) The electrical circuit of Item (15) or Item (26), wherein the substrate is a polymer.

(28) A method for manufacturing an electrical circuit containing a step of forming at least a part of the circuit by impregnating a conductive polymer in a receptive layer.

(29) The method for manufacturing the part of the electrical circuit of Item (28), containing the steps of:
impregnating a solution or a dispersed liquid containing the conductive polymer in the receptive layer; and
forming the part of the electrical circuit by evaporating a solvent of a solution containing the conductive polymer or a dispersant of a dispersed liquid containing the conductive polymer.

(30) The method for manufacturing the electrical circuit of Item (29), wherein the solvent of the solution containing the conductive polymer or the dispersant of the dispersed liquid containing the conductive polymer contains 30% or more of water.

(31) The method for manufacturing the electrical circuit of Item (29), wherein the solvent of the solution containing the conductive polymer or the dispersant of the dispersed liquid containing the conductive polymer contains 5 to 70% by weight of a water soluble organic solvent.

(32) The method for manufacturing the electrical circuit of Item (31), wherein the solvent of the solution containing the conductive polymer or the dispersant of the dispersed liquid containing the conductive polymer contains 10 to 30% by weight of a water soluble organic solvent.

(33) The method for manufacturing the electrical circuit of Item (29), wherein the solution or the dispersed liquid containing the conductive polymer has 0.001 to 1% by weight of a surfactant.

(34) The method for manufacturing the electrical circuit of Item (33), wherein the surfactant is a nonion surfactant.

(35) The method for manufacturing the electrical circuit of Item (28), wherein the part of the electrical circuit is formed by ejecting the conductive polymer onto the receptive layer by a ink-jet printing method so as to impregnate the ejected conductive polymer in the receptive layer.

(36) The method for manufacturing the electrical circuit of Item (29), wherein the solution or the dispersed liquid containing the conductive polymer is impregnated in the receptive layer by ejecting the solution or the dispersed liquid containing the conductive polymer onto the receptive layer by a ink-jet printing method.

(37) The method for manufacturing the electrical circuit of Item (28), wherein an amount of the conductive polymer impregnated in the receptive layer is controlled by controlling an amount of the ejected conductive polymer per unit area.

(38). The method for manufacturing the electrical circuit of Item (29), wherein an amount of the conductive polymer impregnated in the receptive layer is controlled by controlling an amount of the ejected solution or the dispersed liquid containing the conductive polymer per unit area.

(39) The method for manufacturing the electrical circuit of any one of Items (28) to (38),
wherein:
the conductive polymer is an oligomer having a repeat number of 4 to 19 or a polymer having a repeat number of 20 or more; and
the conductive polymer has a repeat unit of thiophene, vinylene, thienylene vinylene, phenylene vinylene, p-phenylene or a substituent compound thereof.

(40) The method for manufacturing the electrical circuit of Item (39), wherein the conductive polymer is an oligomer or a polymer having thiophene or substituted thiophene as a repeat unit.

(41) The method for manufacturing the electrical circuit of Item (39) or Item (40), wherein the oligomer or the polymer contains a dopant.

(42) The method for manufacturing the electrical circuit of any one of Items (28) to (41), wherein an electrical conductivity of the conductive polymer is 0.01 S/cm or more.

(43) The method for manufacturing the electrical circuit of Item (42), wherein the electrical conductivity of the conductive polymer is 1 S/cm or more.

(44) The method for manufacturing the electrical circuit of any one of Items (28) to (43), wherein the receptive layer is porous.

(45) The method for manufacturing the electrical circuit of Item (44), wherein the receptive layer contains inorganic particles.

(46) The method for manufacturing the electrical circuit of Item (45), wherein the inorganic particles are fumed silica particles.

(47) The method for manufacturing the electrical circuit of Item (45) or Item (46), wherein an average particle diameter of the inorganic particles is 0.003 to 0.2 μm.

(48) The method for manufacturing the electrical circuit of Item (47), wherein the average particle diameter of the inorganic particles is 0.005 to 0.1 μm.

(49) The method for manufacturing the electrical circuit of any one of Items (43) to (48), wherein:
the receptive layer further contains a hydrophilic binder; and
a weight ratio of the inorganic particles to the hydrophilic binder is between 2:1 and 20:1.

(50) The method for manufacturing the electrical circuit of any one of Items (28) to (49), wherein the substrate is a polymer.

(51) A method for manufacturing a thin film transistor containing the steps of:
forming a semiconductor layer on a substrate;
forming a receptive layer adjacent to the semiconductor layer;
forming a source electrode in the receptive layer being in contact with the semiconductor layer by impregnating a conductive polymer in the receptive layer;
forming a drain electrode in the receptive layer being in contact with the semiconductor layer by impregnating the conductive polymer in the receptive layer;
forming a gate electrode; and
forming a gate insurator layer:
between the semiconductor layer and the gate electrode; and
between the receptive layer and the gate electrode.

(52) The method for manufacturing the thin film transistor of Item (51), containing the steps of:
impregnating a solution or a dispersed liquid containing the conductive polymer in the receptive layer; and
forming the source electrode and the drain electrode by evaporating a solvent of the solution containing the conductive polymer or a dispersant of the dispersed liquid containing the conductive polymer.

(53) The method for manufacturing the thin film transistor of Item (52), wherein the solvent of the solution containing the conductive polymer or the dispersant of the dispersed liquid containing the conductive polymer contains 30% or more of water.

(54) The method for manufacturing the thin film transistor of Item (52), wherein the solvent of the solution containing the conductive polymer or the dispersant of the dispersed liquid containing the conductive polymer contains 5 to 70% by weight of a water soluble organic solvent.

(55) The method for manufacturing the thin film transistor of Item (54), wherein the solvent of the solution containing the conductive polymer or the dispersant of the dispersed liquid containing the conductive polymer contains 10 to 30% by weight of a water soluble organic solvent.

(56) The method for manufacturing the thin film transistor of Item (52), wherein the solution or the dispersed liquid containing the conductive polymer contains 0.001 to 1% by weight of a surfactant.

(57) The method for manufacturing the thin film transistor of Item (56), wherein the surfactant is a nonion surfactant.

(58) The method for manufacturing the thin film transistor of Item (51), wherein the source electrode and the drain electrode are formed by ejecting the conductive polymer onto the receptive layer by a ink-jet printing method so as to impregnate the ejected conductive polymer in the receptive layer.

(59) The method for manufacturing the thin film transistor of Item (52), wherein the solution or the dispersed liquid containing the conductive polymer is impregnated in the receptive layer by ejecting the solution or the dispersed liquid containing the conductive polymer onto the receptive layer by a ink-jet printing method.

(60) The method for manufacturing the thin film transistor of Item (58), wherein an amount of the conductive polymer impregnated in the receptive layer is controlled by controlling an amount of the ejected conductive polymer per unit area.

(61) The method for manufacturing the thin film transistor of Item (59), wherein an amount of the conductive polymer impregnated in the receptive layer is controlled by controlling an amount of the ejected solution or the dispersed liquid containing the conductive polymer per unit area.

(62) The method for manufacturing the thin film transistor of any one of Items (51) to (61),
wherein:
the conductive polymer is an oligomer of which a repeat number is 4 to 19 or a polymer of which a repeat number is 20 or more; and
the conductive polymer has a repeat unit of thiophene, vinylene, thienylene vinylene, phenylene vinylene, p-phenylene or substituent compounds thereof.

(63) The method for manufacturing the thin film transistor of Item (62), wherein the conductive polymer is an oligomer or a polymer having thiophene or substituted thiophene as a repeat unit.

(64) The method for manufacturing the thin film transistor of Item (62) or Item (63), wherein the oligomer or the polymer contains a dopant.

(65) The method for manufacturing the thin film transistor of any one of Items (51) to (64), wherein an electrical conductivity of the conductive polymer is 0.01 S/cm or more.

(66) The method for manufacturing the thin film transistor of Item (65), wherein the electrical conductivity of the conductive polymer is 1 S/cm or more.

(67) The method for manufacturing the thin film transistor of any one of Items (51) to (66), wherein the receptive layer is porous.

(68) The method for manufacturing the thin film transistor of Item (67), wherein the receptive layer contains inorganic particles.

(69) The method for manufacturing the thin film transistor of Item (68), wherein the inorganic particles are fumed silica particles.

(70) The method for manufacturing the thin film transistor of Item (68) or Item (69), wherein an average particle diameter of the inorganic particles is 0.003 to 0.2 μm.

(71) The method for manufacturing the thin film transistor of Item (70), wherein the average particle diameter of the inorganic particles is 0.005 to 0.1 μm.

(72) The method for manufacturing the thin film transistor of any one of Items (64) to (71), wherein:
the receptive layer further contains a hydrophilic binder; and
a weight ratio of the inorganic particles to the hydrophilic binder is between 2:1 and 20:1.

(73) The method for manufacturing the thin film transistor of any one of Items (51) to (72), wherein the substrate is a polymer.

DESCRIPTION OF THE PREFERRED EMBODIMENTS

The embodiments of the present invention will now be detailed with reference to the drawings, but the present invention is not limited thereto. Further, in the following description, some of the terms are used to refer to specific meanings. Such cases show preferred examples of the present invention, and neither the meaning of the terms nor the technical range of the present invention is limited thereto. Incidentally, in the description of the figures, description for numerals which are the same as those used in FIG. 1 and FIGS. 2(a)-2(d) are occasionally omitted. However, numerals refer to the same description used in FIG. 1 and FIGS. 2(a)-2(d), unless otherwise specified.

Figure 1:
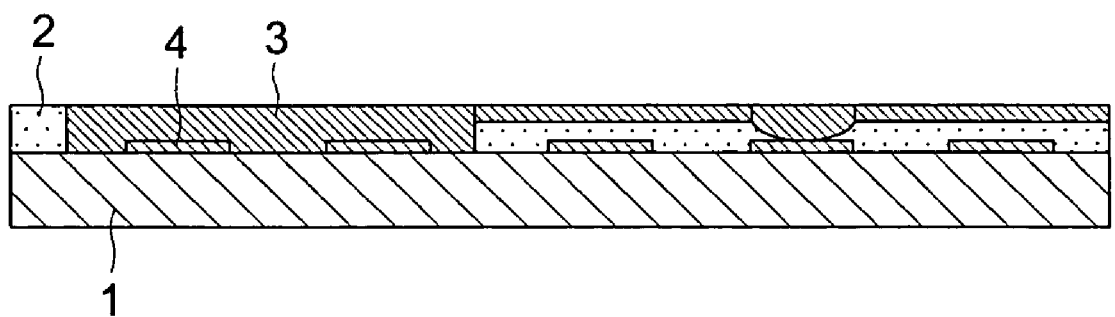
FIG. 1 is a sectional view showing one example of the electrical circuit of the present invention.

FIG. 1 is a sectional view of one example of the eclectic circuit of the present invention.

In FIG. 1, numeral 1 is a substrate, while 2 is a receptive layer. Numeral 3 is a circuit pattern which is formed by impregnating conductive polymers into receptive layer 2. Numeral 4 is a terminal, and for example, when an electrical circuit is a thin film transistor, refers to a source bus line, a display electrode, or a semiconductor.

The electrical circuit of FIG. 1 incorporates receptive layer 2 on substrate 1, and circuit pattern 3 is formed by impregnating conductive polymers into the above receptive layer However, in the electrical circuit of the present invention, not all the circuit patterns may be formed with conductive polymers provided that at least some part of them is formed by impregnating conductive polymers into receptive layer 2 to form circuit pattern 3. Since the conductive polymer is not accumulated on the surface of receptive layer 2, but is impregnated and fixed within receptive layer 2, undesirable spread of conductive polymers is suppressed, whereby it is possible to form detailed circuit pattern 3.

Further, even though the surface of receptive layer 2 may suffer from damage due to accidental scratches, it is possible to minimize the damage due to the fact that circuit pattern 3 is impregnated into the receptive layer. Consequently, differing from the conventional technique, it is unnecessary to provide a protective film on the surface of the receptive layer. Further, since durability is enhanced by providing receptive layer 2, a heat treatment process such as annealing is not necessary. Accordingly, it is possible to quickly and simply produce electrical circuits.

Figure 2:
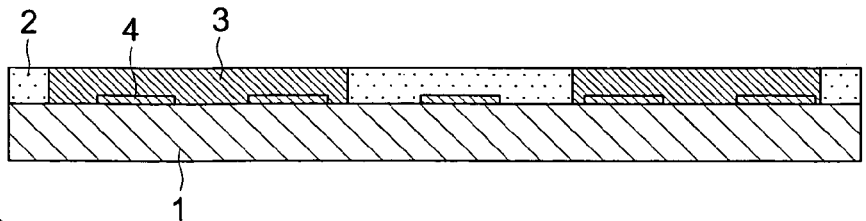
FIG. 2(a) to FIG. 2(c) illustrate one example of the production process of the electrical circuit of the present invention.
FIG. 2(d) is a plan view showing part of the electrical circuit of the present invention.
Figure 2:
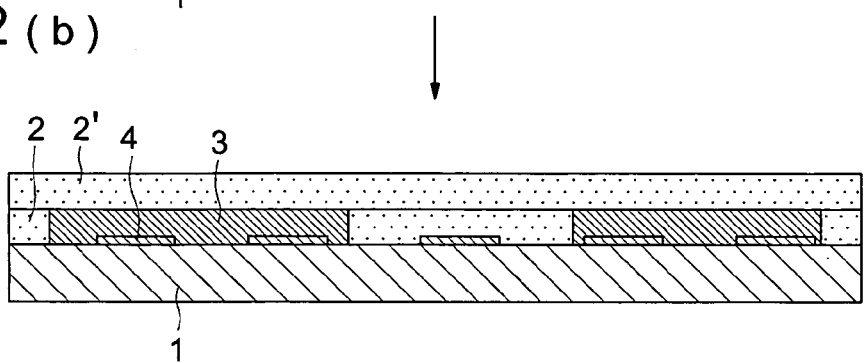
Figure 2:
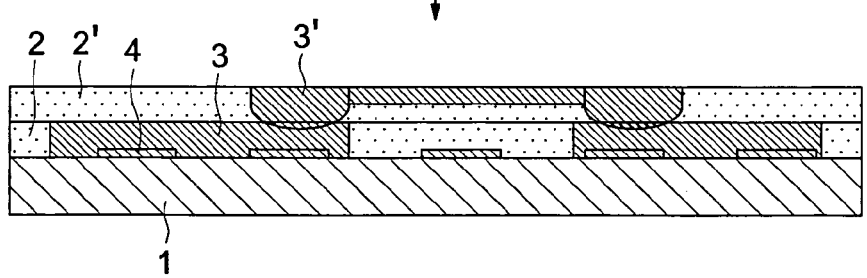
Figure 2:
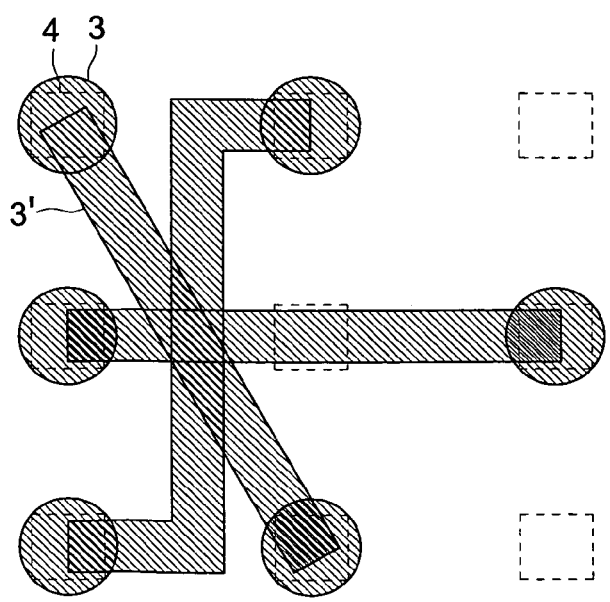

Still further, in the electrical circuit of the present invention, electrical circuit pattern 3 is formed by impregnating conductive polymers into receptive layer 2, whereby it is possible to form complex circuit patterns. For example, as shown in FIGS. 2(a)-2(c) of the production process of the electrical circuit, as well as in FIG. 2(d) of the plan view of the electrical circuit, circuit pattern 3 is formed in receptive layer 2 (FIG. 2(a)), and receptive layer 2' is provided thereon (FIG. 2(b)). Further, new circuit pattern 3' is formed on receptive layer 2'. By combining circuit pattern 3 with circuit pattern 3' (FIG. 2(c)), it becomes possible to form more complex circuit patterns 3, 3' (FIG. 2(d)).

The present invention will now be described in more detail.

π conjugated oligomers and π conjugated polymers are preferably employed as a conductive polymer of the present invention. Examples of usable compounds include polypyrroles such as polypyrrole, poly(N-substituted pyrrole), poly (3-substituted pyrrole), or poly(3, or 4-disubstituted pyrrole; polythiophenes such as polythiophene, poly(3-substituted thiophene), poly(3,4-disubstituted thiophene), or polybenzothiophene; polyisothionaphthenes such as polyisothianaphthene; polythienylene vinylenes such as polythienylene vinylene; poly(p-phenylene vinylene)s such as poly (p-phenylene vinylene); polyanilines such as polyaniline, poly(N-substituted aniline), poly(3-substituted aniline), or poly(2,3-disubstituted aniline); polycetylenes such as polyacetylene; polydiacetylenes such as polydiacetylene; polyazulenes such as polyazulene; polypylenes such as polypylene; polycarbazoles such as polycarbazole or poly(N-substituted carbazole), polyselenophenes such as polyselenophene; polyfurans such as polyfuran or polybenzofuran; poly(p-phenylene)s such as poly(phenylene); polyindoles such as polyindole; polypyridazines such as polypyridazine; polyacens such as naphthacene, pentacene, hexacene, heptacene, dibenzopentacene, tetrabenzopentacene, pyrene, dibenzopyrene, chrysene, perylene, coronene, terylene, ovalene, quoterylene, or circumanthrathene; derivatives (triphenodioxazine, triphenodithiazine, and hexacene-6,15-quinone) in which some of the carbon atoms of polyacenes are substituted with atoms such as N, S, or O, or functional groups such as a carboxyl group; polymers such as polyvinyl carbazole, polyphenylene sulfide, or polyvinylene sulfide; and polycyclic condensation products described in JP-A No. 11-195790. Further, preferably employed compounds include oligomers such as α-sexithiophene-α,ω-dihexyl-α-sexithiophene, α,ω-dihexyl-α-quikethiophene, and α,ω-bis(3-butoxypropyl)-α-sexithiophene, which are thiophene hexamers having the same repeat units as the above polymers, as well as styrylbenzene derivatives.

Among these π conjugated oligomers and π conjugated polymers, preferred is at least one of:

the oligomers having repeat numbers of 4 to 19 or the polymers having repeat numbers of 20 or more; and the oligomers or the polymers having a repeat unit of thiophene, vinylene, thienylene vinylene, phenylene vinylene, p-phenylene or substituent compounds thereof. It is also preferable that two or more of the above repeat units are contained in the oligomers having repeat numbers of 4 to 19 or in the polymers having repeat numbers of 20 or more. Specifically, oligomers or polymers containing thiophene or substituted thiophen are preferably used.

Specific example include polystyrene sulfonic acid complexes (PEDOT/PSS complexes) (Baytron B, available from Bayer Corp.) of poly(ethylene dioxythiophene).

Preferable conductive polymers employed in the present invention include the above mentioned π conjugated oligomers or π conjugated polymers being subjected to a doping treatment.

Preferred as dopants employed for the above doping treatment are anion dopants (p type dope), in view of the stability. The electrical conductivity of the conductive polymer is preferably 0.01 S/cm or more, and more preferably 1 S/cm or more.

Doping means that electron accepting molecules (acceptors) or electron donating molecules (donors) are introduced into the aforesaid oligomers or polymers as a dopant.

Employed as dopants in the present invention include either acceptors or donors. Listed as such acceptors include halogen compounds such as $Cl_2$, $Br_2$, $I_2$, ICl, $ICl_3$, IBr, IF; Lewis acids such as $PF_5$, $AsF_5$, $SbF_5$, $BF_3$, $BCl_3$, $BBr_3$, or $SO_3$; protonic acids such as HF, HCl, $HNO_3$, $H_2SO_4$, $HClO_4$, $FSO_3H$, $ClSO_3H$, or $CF_3SO_3H$; organic acids such as acetic acid, formic acid, or amino acids; transition metal compounds such as $FeCl_3$, FeOCl, $TiCl_4$, $ZrCl_4$, $HfCl_4$, $NbF_5$, $NbCl_5$, $TaCl_3$, $MoCl_3$, $WF_5$, $WCl_6$, $UF_6$, $LnCl_3$ (Ln represents lantanoids such as La, Ce, Nd, or Pr and Y); and electrolyte anions such as $Cl^-$, $Br^-$, $I^-$, $ClO_4^-$, $PF_6^-$, $AsF_5^-$, $SbF_6^-$, $BF_4^-$, or a sulfonic acid anion. Listed as donors include alkaline metals such as Li, Na, K, Rb, or Cs; alkaline earth metals such as Ca, Sr, and Ba; rare earth metals such as Y, La, Ce, Pr, Nd, Sm, Eu, Gd, Tb, Dy, Ho, Er, or Yb; and other donors such as an ammonium ion, $R_4P^+$, $R_4As^+$, $R_3S^+$, or acetylcholine. Any conventional doping methods for these dopants may be utilized without any limitation. For example, it is possible to employ either a method in which a thin oligomer or polymer film is previously prepared and dopants are later introduced, or a method in which dopants are introduced during formation of the thin film of organic semiconductors. Listed as doping methods in the former methods include:

a gas phase doping method in which gaseous dopants are employed;

a liquid phase doping method in which doping is performed in such a manner that liquid dopants are brought into contact with the aforesaid thin film; and a solid phase doping method in which solid state dopants are brought into contact with the aforesaid thin film, followed by the diffusion of the dopants. In the liquid phase doping, it is possible to control the doping efficiency by electrolysis. Also, in the liquid phase doping, a solution or a dispersed liquid containing a mixture of an organic semiconductor compound and a dopant, or a mixture of an organic semiconductor compound and a complex containing the dopant may be coated then dried. When a vacuum deposition method is employed, it is possible to introduce dopants via deposition of organic semiconductor compounds together with dopants. On the other hand, when a thin film is prepared employing a sputtering method, it is possible to introduce dopants into a thin film, employing sputtering using two targets, namely, targets of an organic semiconductor compound and of a dopant. Further, employed as other methods include chemical doping such as electrochemical doping and photo-induced doping, and physical doping such as ion injection which is described, for example, in Kogyo Zairyo (Industrial Materials) Volume 34, No. 4, page 55. 1986.

It is preferable that the circuit patterns of the electrical circuit of the present invention are prepared by impregnating conductive polymers into the aforesaid receptive layer, employing an ink-jet method, whereby it is possible to more simply produce detailed electrical circuits.

The electrical circuit of the present invention is preferably formed by forming a circuit pattern by impregnating a conductive polymer in the receptive layer by a ink-jet method. This method enables formation of an electrical circuit having a fine pattern in a simple process. Further, in the present invention, it is preferable to form a circuit pattern in such a manner that the impregnated amount of conductive polymer is controlled by controlling the amount of ejected conductive polymer per unit area employing an ink-jet method. The impregnated amount, as described herein, refers to the impregnation distance of conductive polymers in the receptive layer in the thickness direction. Since the electrical circuit of the present invention is formed by impregnating a conductive polymer into the receptive layer, in a portion where the conductive polymer layer is intended to be electrically connected with terminal 4 in the electrical circuit described in FIG. 1, the ejected amount of the conductive polymer solution per unit area may be increased so as to increase the impregnated amount of conductive polymers in that portion, resulting in forming an connection between the conductive polymer layer and terminal 4. Alternatively, in a portion where the conductive polymer layer is intended not to connect with terminal 4, the ejected amount of the conductive polymer solution per unit area may be decreased so as to decrease the impregnated amount of conductive polymers in that portion, resulting in forming no connection between the conductive polymer layer and terminal 4. With using this method, many variations may be introduced in circuit patter 3, whereby it becomes possible to form a variety of circuit patterns 3.

In the present invention, for impregnating the aforementioned conductive polymer into the receptive layer, it is preferable to use a solution or dispersed liquid containing a conductive polymer. As solvents or dispersant, water or any arbitrary organic solvents may be used. However, in view of affinity with the receptive layer, which will be described below, it is preferable that 30% or more of water is contained. When an organic solvent is used, a water-soluble solvent is preferable.

Listed as water-soluble organic solvents usable in the present invention include, for example: alcohols (e.g., methanol, ethanol, propanol, isopropanol, butanol, isobutanol, secondary butanol, tertiary butanol, pentanol, hexanol, cyclohexanol, and benzyl alcohol); polyhydric alcohols (e.g., ethylene glycol, diethylene glycol, triethylene glycol, polyethylene glycol, propylene glycol, dipropylene glycol, polypropylene glycol, butylene glycol, hexanediol, pentanediol, glycerin, hexanetriol, and thioglycol); polyhydric alcohol ethers (e.g., ethylene glycol monomethyl ether, ethylene glycol monoethyl ether, ethylene glycol monobutyl ether, diethylene glycol monomethyl ether, diethylene glycol monomethyl ether, diethylene glycol monobutyl ether, propylene glycol monomethyl ether, propylene glycol monobutyl ether, ethylene glycol monomethyl ether acetate, triethylene glycol monomethyl ether, triethylene glycol monomethyl ether, triethylene glycol monobutyl ether, ethylene glycol monophenyl ether, and propylene glycol monophenyl ether); amines (e.g., ethanolamine, diethanolamine, triethanolamine, N-methyldiethanolamine, N-ethyldiethanolamine, morpholine, N-ethylmorpholine, ethylenediamine, diethylenediamine, triethylenetetramine, tetraethylenepentamine, polyethyleneimine, pentamethyldiethylenetriamine, and tetramethylpropylenediamine; amides (e.g., formamide, N,N-dimethylformamide, and N,N-dimethylacetamide); heterocycles (e.g., 2-pyrrolidone, N-methyl-2-pyrrolidone, cyclohexylpyrrolidone, 2-oxazolidone, 1,3-dimethyl-2-imidazolidinone); sulfoxides (e.g., dimethylsulfoxide); sulfones (e.g., sulfolane); others such as urea, acetonitrile, and acetone. Listed as preferred water-soluble organic solvents are polyhydric alcohols. Further, it is specifically preferable that polyhydric alcohols and polyhydric alcohol ethers are used in combination.

Water-soluble organic solvents may be employed alone or in combinations of a plurality of the solvents. The added amount of a water-soluble solvent is commonly 5-70 percent by weight based on the total weight, but is preferably 10-30 percent by weight.

In addition, it is possible to add a variety of surfactants. Specifically, when a conductive polymer solution or dispersed liquid is ejected by an ink-jet method, the resulting surface tension is preferably controlled in the range of $30 \times 10^{-3}$ to $40 \times 10^{-3}$ N/m by adding a surfactant. When an anion doped conductive polymer is employed, a nonionic surfactant is suitably used. When an ink-jet method is employed, the viscosity of the solution or dispersed liquid containing the conductive polymer is preferably controlled within 1 to 15 cp, by adjusting the concentration of the conductive polymer.

As an ink-jet head of an ink-jet printer, any of conventionally used piezo head or thermal head is appropriately employed. Further, either an on-demand system or a continuous system may be employed.

In the present invention, the receptive layer is designated as a layer in which the conductive polymer is absorbed and fixed by impregnating the conductive polymer in it.

The receptive layer may be classified mainly into a swelling type and a porous type. The swelling type layer is prepared by coating a composition containing water-soluble binders, for example, gelatin, water-soluble polymers other than gelatin, latex, and polyurethane. These binders may be used alone or in combination. Gelatin and other water-soluble polymers are preferably used in the receptive layer because of the large absorbing capacity and the high drying rate.

Any gelatin may be employed as long as the gelatin is prepared employing animal collagen as a raw material. However, more preferred is gelatin prepared employing pigskin collagen, cattle hide collagen, or cattle bone collagen as a raw material. The kinds of gelatin are not specifically limited, and include lime-processed gelatin, acid-processed gelatin and gelatin derivatives (for example, disclosed in Examined Japanese Patent Publication Nos. 38-4854, 39-5514, 40-12237, and 42-26345; U.S. Pat. Nos. 2,525,753, 2,594,293, 2,614,928, 2,763,639, 3,118,766, 3,132,945, 3,186,846, and 3,312,553; and British Patent Nos. 861,414 and 103,189), and they may be used alone or in combination. Use of acid-processed gelatin is advantageous in order to increase water resistance.

Listed as water-soluble polymers preferably employed in the swelling type receptive layer other than gelatin include, for example, vinyl formals such as polyvinyl alcohols, polyvinylpyrrolidones, polyvinylpyridinium halide, or various. modified polyvinyl alcohols and derivatives thereof (refer to JP-A Nos. 60-145879, 60-220750, 61-143177, 61-235182, 61-235183, 61-237681, and 61-261089); polymers containing an acryl group (disclosed in JP-A Nos. 60-168651 and 62-9988) such as polyacryl amide, polydimethylacryl amide, polydimethylaminoacrylate, sodium polyacrylate, acrylic acid-methacrylic acid copolymers, sodium polymethacrylate, acrylic acid-vinyl alcohol copolymer salts; natural polymers or derivatives thereof (disclosed in JP-A Nos. 59-174382, 60-262685, 61-143177, 61-181679, 61-193879, and 61-287782) such as starch, oxidized starch, carboxyl starch, dialdehyde starch, cationized starch, dextrin, sodium alginate, gum Arabic, casein, pullulan, dextran, methyl cellulose, ethyl cellulose, carboxymethyl cellulose, or hydroxypropyl cellulose; and synthetic polymers (disclosed in JP-A Nos. 61-32787, 61-237680, and 61-277483) such as polyethylene glycol, polypropylene glycol, polyvinyl ether, polyglycerin, alkyl maleate-vinyl ether copolymers, maleic acid -N-vinyl-pyrrole copolymers, styrene-maleic anhydride copolymer. Of these polymers, preferred are polyvinyl pyrrolidone, polyvinyl alcohols, or polyalkylene oxides.

Preferred as porous receptive layer are those which are prepared in such a manner that micro particles and water-soluble binders are mixed and then coated.

Micro particles usable in the present invention include inorganic and organic particles. However, specifically preferred are inorganic particles since they are easily obtained. Examples of such inorganic particles include white inorganic pigments such as precipitated calcium carbonate, heavy calcium carbonate, magnesium carbonate, kaolin, clay, talc, calcium sulfate, barium sulfate, titanium dioxide, zinc oxide, zinc hydroxide, zinc sulfide, zinc carbonate, hydrotalsite, aluminum silicate, diatomaceous earth, calcium silicate, magnesium silicate, synthetic non-crystalline silica, colloidal silica, alumina, colloidal alumina, pseudo boehmite, aluminum hydroxide, lithopone, zeolite, or magnesium hydroxide. It is possible to use the above inorganic particles in the form of primary particles without any modification or in the state in which secondary coagulated particles are formed.

In the present invention, preferred as inorganic particles are alumina, pseudo boehmite, and colloidal silica, as well as minute silica particles synthesized by a vapor deposition method which are also referred to as fumed silica particles. Of these, most preferred are minute silica particles synthesized by a vapor deposition method (also referred to as fumed silica particles). Also, the surface of the fumed silica particle may be modified by Al. The content of Al in the Al modified fumed silica particles is preferably 0.05 to 5 percent by weight based on the weight of silica.

It is possible to use any diameter of the above micro inorganic particles. However, the average particle diameter is preferably not more than 1 μm, but specifically preferably not more than 0.1 μm. Even though the lower limit of the particle diameter is not specified, it is preferably not less than 0.003 μm, but is more preferably not less than 0.005 μm, in order to efficiently produce the particles.

The average diameter of the above inorganic particles is determined as follows. The section and surface of a porous layer is observed through an electron microscope, and the diameter of randomly selected 100 particles is determined. Subsequently, the simple average value (the number average value) is obtained. Herein, "the particle diameter" refers to the diameter of a circle having the same area as the projective area of the particle.

The above micro particles may exist in the porous layer as primary particles, secondary particles, or higher order coagulated particles. The average particle diameter, as described above, refers to the diameter of a particle which is individually formed in the porous layer under the observation of an electron microscope.

The amount of the above micro particles in an aqueous coating composition is 5 to 40 percent by weight, but is more preferably 7 to 30 percent.

Hydrophilic binders incorporated in a porous receptive layer are not particularly limited, and it is possible to use conventional hydrophilic binders known in the art. For example, employed may be gelatin, polyvinylpyrrolidone, polyethylene oxide, polyacrylamide, and polyvinyl alcohol. Of these, polyvinyl alcohol is specifically preferable.

Polyvinyl alcohol is a polymer which exhibits interaction with inorganic particles, resulting in strong holding force for inorganic particles, and also exhibits hygroscopicity of relatively small humidity dependence. In addition to the common polyvinyl alcohol prepared by hydrolyzing polyvinyl acetate, polyvinyl alcohols preferably employed in the present invention include a modified polyvinyl alcohols, for example, a cation-modified polyvinyl alcohol of which end is cation-modified or an anion-modified polyvinyl alcohol having an anionic group.

The average polymerization degree of polyvinyl alcohol prepared by hydrolyzing vinyl acetate is preferably not less than 300, and is more preferably 1,000 to 5,000. The saponification ratio is preferably 70 to 100 percent, and is more preferably 80 to 99.5 percent.

Examples of cation-modified polyvinyl alcohol include those having a primary, secondary or tertiary amino group, or a quaternary ammonium group in the main chain or the side chain of the above polyvinyl alcohol which are, for example, disclosed in JP-A No. 61-10483. Such polyvinyl alcohol is prepared by saponifying a copolymer of vinyl acetate and an ethylenically unsaturated monomer having a cationic group.

Listed as ethylenically unsaturated monomers having a cationic group include, for example, trimethyl-(2-acrylamido-2,2-dimethylethyl)ammonium chloride, trimethyl-(3-acrylamido-3,3-dimethylpropyl)ammonium chloride, N-vinylimidazole, N-vinyl-2-methylimidazole, N-(3-dimethylaminopropyl)methacrylamide, hydroxyethyltrimethylammonium chloride, trimethyl-(3-methsacylamidopropyl)ammonium chloride, and N-(1,1-dimethyl-3-dimethylaminopropyl)acrylamide.

The ratio of monomers having a cation-modified group of cation-modified polyvinyl alcohol is commonly 0.1 to 10 mol percent based on vinyl acetate, but is preferably 0.2 to 5 mol percent.

Listed as anion-modified polyvinyl alcohols include, for example, polyvinyl alcohol having an anionic group disclosed in JP-A No. 1-206088, a copolymer of polyvinyl alcohol and a vinyl compound having a water-soluble group disclosed in JP-A Nos. 61-237681 and 63-307979, and modified polyvinyl alcohol having a water-soluble group disclosed in JP-A No. 7-285265.

Further listed as nonion-modified polyvinyl alcohols include, for example, a polyvinyl alcohol derivative in which a polyalkylene oxide group is added to a part of vinyl alcohol, disclosed in JP-A No. 7-9758, and a block copolymer of a vinyl compound having a hydrophobic group and vinyl alcohol, disclosed in JP-A No. 8-25795.

Polyvinyl alcohols may be employed in combinations of at least two types being different in the degree of polymerization or in kinds of modifications. Specifically, when polyvinyl alcohol having a degree of polymerization of 2,000 or more is employed, it is preferable that polyvinyl alcohol having a degree of polymerization of 1,000 or less is initially mixed with dispersed inorganic particle, the amount of the polyvinyl alcohol being 0.05 to 10 percent by weight, but preferably 0.1-5 percent by weight, based on the weight of the inorganic particles. The mixture was, then, further mixed with a polyvinyl alcohol having a degree of polymerization of 2,000 or more. In this way, a drastic increase in viscosity is avoided.

The ratio of micro particles to hydrophilic binders in a porous receptive layer is preferably between 2:1 and 20:1 by weight. When the weight ratio of micro particles is less than 2:1, the porosity of the porous layer decreases, whereby it becomes difficult to obtain a sufficient pore volume, and in addition, excessively existing hydrophilic binders tends to swell during ink-jet printing, resulting in sealing the pores and, further, resulting in an decrease in the absorption rate of a conductive polymer. On the other hand, when the weight ratio of micro particles is more than 20:1, cracking tends to occur, especially when a relatively thick porous layer is formed. The ratio of micro particles to a hydrophilic binder in a prous receptive layer is preferably between 2.5:1 and 12:1 by weight, but more preferably between 3:1 and 10:1 by weight.

In the electrical circuit of the present invention, the receptive layer is preferably a porous layer. By employing the porous receptive layer, the impregnation rate of a solution or a dispersed liquid containing the conductive polymer is increased, whereby the patterning accuracy is enhanced. Further, compared to the swelling type receptive layer, the conductivity of the impregnated portion is larger. In addition, depending on the properties of a conductive polymer, it is possible to appropriately select micro particles and hydrophilic binders, whereby it is possible to easily control the degree of impregnation of the conductive polymer.

The thickness of the receptive layer is preferably in the range of 0.05 to 50 μm, but more preferably in the range of 0.5 to 20 μm.

Since the electrical circuit of the present invention has a receptive layer provided on the substrate, it exhibits higher durability and, as a result, a process of annealing the electrical circuit at a high temperature is not necessary. Accordingly, in addition to the conventionally employed substrate materials such as glass, a high melting point resin, silicone, or a metal film, a variety of polymer materials are usable as a substrate in the electrical circuit of the present invention. By using a variety of polymer materials, the electrical circuit of the present invention has become possible to be applied to a flexible print circuit or a flexible display.

Listed as usable polymers include, for example, polyesters such as polyethylene terephthalate (PET) and polyethylene naphthalate (PEN), polyvinylidene chloride, polyvinyl alcohol, polyethylene vinyl alcohol, syndiotactic polystyrene, polyethylene, polypropylene, cellophane, polyether sulfone (PES), polyether imide, polyether ether ketone, polysulfone, polyphenylene sulfide, polyacrylate, polyimide, polyamide, polycarbonate (PC), norbornene resins, polymethyl pentene, fluoric resins, nylon, polymethyl methacrylate, acryl or polyarylates, cellulose esters such as cellulose triacetate (TAC), cellulose diacetate propionate (CAP), cellulose acetate butyrate, cellulose acetate phthalate, cellulose nitrate, and derivatives thereof.

These polymer films may be subjected to surface treatment or surface coating known in the art. For example, formed as a gas barrier layer include: a film which is prepared by co-deposition of silicon oxide and aluminum oxide; a film of a mixture of metal oxides such as silicon oxide and aluminum oxide, which is prepared employing an atmospheric pressure plasma method; and a multilayer composite film thereof. A composite film may be prepared by laminating a film formed by deposition of a thin layer of metal such as aluminum by an evaporation method. A film may also be mixed with micro particles of a metal oxide. As noted above, by employing a plastic film as the substrate, it is possible to decrease the weight of the circuit compared to the case when a glass substrate is used. Moreover, portability is enhanced as well as durability against impact is increased.

The term, "a circuit pattern formed with conductive materials" refers to a pattern of an electrode or an electric wiring formed by using conductive materials. However, the present invention is not limited thereto. A member existing in the electrical circuit and the member being capable of forming by using the conductive polymer may also be included in the circuit pattern.

The thin film transistor of the present invention will now be explained.

Figure 3A:
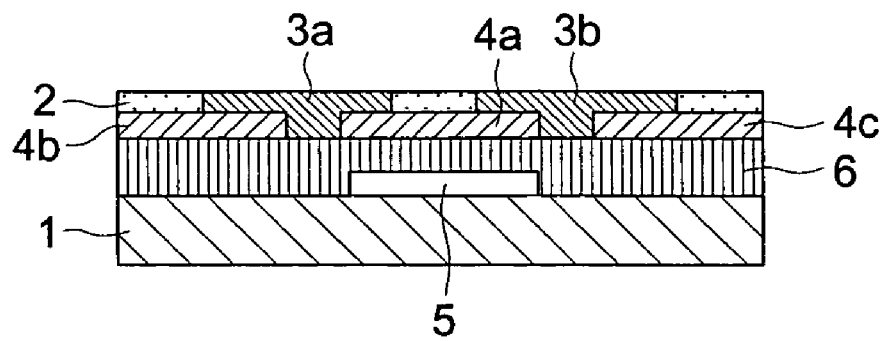
FIG. 3(a) is a sectional view of one example of the thin film transistor of the present invention.
Figure 3B:
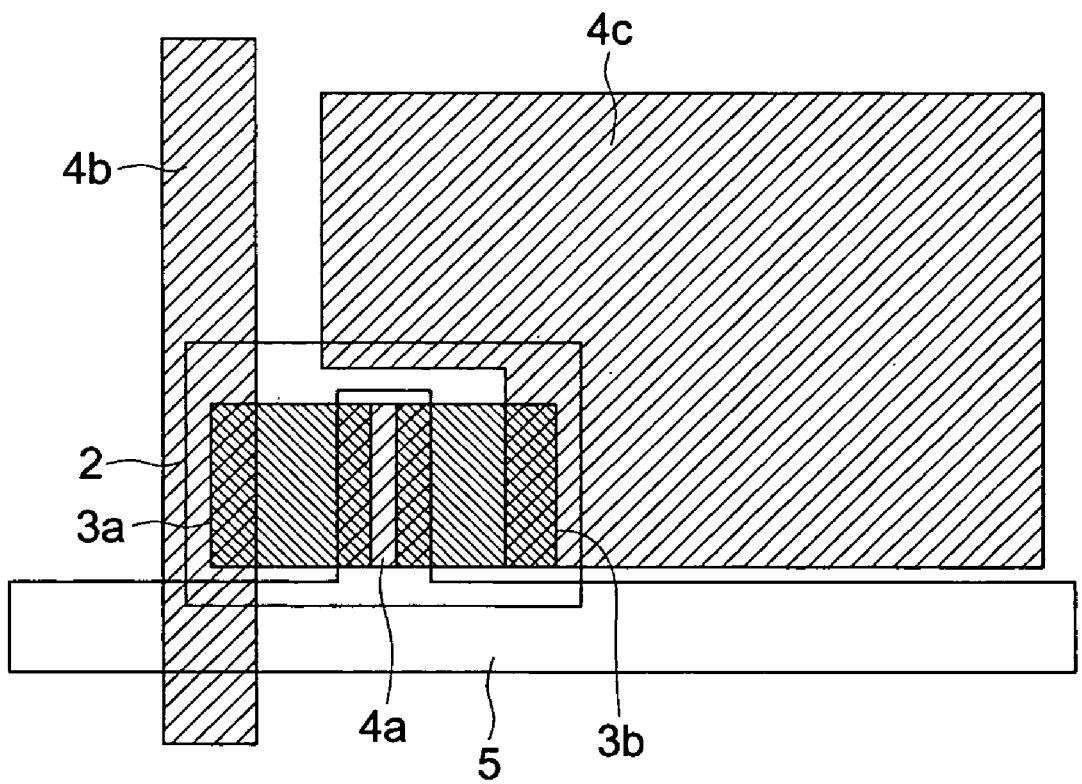
FIG. 3(b) is a plan view of one example of the thin film transistor of the present invention.

In FIG. 3(a), shown is a sectional view of one example of the thin film transistor of the present invention, while in FIG. 3(b), shown is a plan view of one example of the thin film transistor of the present invention.

In FIG. 3, numeral 1 is a substrate, while 2 is a receptive layer. Further, 3a is a source electrode, and 3b is a drain electrode, while 4a is a semiconductor, 4b is a source bus line, and 4c is a pixel electrode. It is possible to use the pixel electrode as an input electrode of sensors, as well as an address electrode or an output electrode of displays. Numeral 5 is a gate electrode, 6 is a gate insulating layer which insulates gate electrode 5 from semiconductor layer 4a, source bus line 4b, and display electrode 4c. As substrate 1 and receptive layer 2, the aforementioned substrate and receptive layer are applicable.

In the thin film transistor of the present invention, circuit patterns of source electrode 3a and drain electrode 3b are formed by impregnating conductive polymers into receptive layer 2. The conductive polymers are not accumulated on the surface of receptive layer 2 but impregnated into the interior of the receptive layer and fixed. As a result, spread of the conductive polymers is limited, whereby it is possible to form fine and complicated source electrode 3a as well as drain electrode 3b.

Further, even though the surface of receptive layer 2 has damage such as scratches, in the thin film transistor of the present invention, source electrode 3a and drain electrode 3b are impregnated in the receptive layer, whereby damage for the circuit is only limited. As a result, no protective layer on the surface of the receptive layer is needed, which has conventionally been necessary. In addition, since durability is enhanced by providing receptive layer 2, no heat treatment such as annealing is needed. Consequently, a thin film transistor is manufactured in a short and simple process.

In the thin film transistor of the present invention, source electrode 3a and drain electrode 3b are formed by impregnating a conductive polymer into receptive layer 2. These electrode can be formed by using the above mentioned conductive polymers.

The thin film transistor of the present invention will now be detailed.

It is preferable that in the thin film transistor of the present invention, the source electrode and the drain electrode are formed by impregnating a conductive polymer into the above receptive layer, employing an ink-jet method. As a result, it becomes possible to simply and accurately produce thin film transistors.

The thickness of the source electrode as well as the drain electrode is not practically limited as long as both are impregnated into the above receptive layer. The thickness is preferably 0.05 to 50 μm, but is more preferably 0.5 to 20 μm.

Moreover, in the thin film transistor of the present invention, it is preferable that the source electrode as well as the drain electrode is formed by controlling the impregnated amount of conductive polymers while controlling the ejection amount of the conductive polymer solution per unit area of the receptive layer, employing an ink-jet method. As a result, it becomes possible to form a variety of source electrodes as well as drain electrodes.

In the thin film transistor of the present invention, it is preferable that the receptive layer is a porous layer. By employing the porous receptive layer, it is possible to suitably select micro particles as well as hydrophilic binders according to the properties of the conductive polymers, whereby it is possible to easily control the degree of impregnation of conductive polymers.

As the substrate of the thin film transistor of the present invention, various polymer materials can be used because no annealing process is needed due to enhanced durability as the result of providing the receptive layer. It becomes possible to apply substrates to electrical circuits which may be used, for example, for flexible print circuits and flexible displays. Above mentioned polymers are preferably used for the substrate.

Electrode materials employed for gate electrodes, source bus lines, and pixel electrodes of the thin film transistor of the present invention are not specifically limited as long as they are conductive materials. Employed are platinum, gold, silver, nickel, chromium, iron, tin, antimony lead, tantalum, indium, palladium, tellurium, rhenium, iridium, aluminum, ruthenium, germanium, molybdenum, tungsten, tin oxide.antimony, indium oxide.tin (ITO), fluorine-doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, sodium-potassium alloy, magnesium/copper mixtures, magnesium/silver mixtures, magnesium/aluminum mixtures, magnesium/indium mixtures, aluminum/aluminum oxide mixtures, and lithium/aluminum mixtures. Of these, specifically preferable are platinum, gold, silver, copper, aluminum, indium, ITO, and carbon.

Examples of methods for forming a gate electrode, a source bus line, and a display electrode include:

preparing a conductive thin film employing a evaporation method or a sputtering method followed by patterning the film using a photolithographic method or a lift-off method to form the electrodes;

forming a resist pattern on a metal film, for example, an aluminum film or a copper film employing a thermal transfer method or an ink-jet method, followed by etching;

directly forming a pattern of a solution of conductive polymer, a dispersed liquid containing conductive polymer or conductive micro particles, employing an ink-jet method;

forming a pattern of a metal layer employing lithography or laser ablation; and printing a pattern of a conductive ink containing such as a conductive polymer, conductive micro particles, or a conductive paste employing a printing method, for example, relief printing, intaglio printing, lithography, or screen printing.

A variety of insulator films are applicable for a gate insulation layer of the thin film transistor of the present invention. Specifically, inorganic oxide films exhibiting a high dielectric constant are preferable. Listed as inorganic oxides include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth tantalate niobate, and yttrium trioxide. Of these, preferred are silicon oxide, aluminum oxide, tantalum oxide, and titanium oxide. In addition, inorganic nitrides and nitride-oxides such as silicon nitride as well as aluminum nitride are also preferable.

Listed as methods for forming the above films include: dry process methods such as a vacuum evaporation method, a molecular beam epitaxial deposition method, an ion cluster beam method, a low energy ion beam method, an ion plating method, a CVD method, a sputtering method, or an atmospheric pressure plasma method; as well as wet process methods such as coating methods including a spray coating method, a spin coating method, a blade coating method, a dip coasting method, a casting method, a roller coating method, a bar coating method, and a die coating method, and methods forming patterns such as a printing method or an ink-jet method. These methods are employed depending on materials.

The wet processes include, for example:

a method to apply and dry a dispersed liquid of micro particles of an inorganic oxide in any kind of organic solvent or water containing solvent, together with a dispersing agent, for example, a surfactant; and a method to apply and dry a solution of a precursor of an inorganic oxide, for example, an alcoxide, so-called a sol-gel method.

Of these, preferable is an atmospheric pressure plasma method.

A method for forming a gate insulation layer, employing a plasma filming process under an atmospheric pressure, refers to the method in which a reactive gas is subjected to plasma excitation while discharged under an atmospheric pressure or a pressure near the atmospheric pressure, and a thin film is formed on a substrate. The above method is described, for example, in JP-A Nos. 11-61406, 11-133205, 2000-121804, 2000-147209, and 2000-185362. This method makes it possible to form a highly functional thin film at higher productivity.

Further, materials to form an organic compound film include, for example: polyimide, polyamide, polyester, polyacrylate, a photocurable resin based on photo-radical polymerization, a photocurable resin based on photo-cation polymerization, polyacrylonitrile, polymethacrylonitrile, a copolymer containing acrylonitrile or methacrylonitrile component, polyvinylphenol, polyvinyl alcohol, a novolac resin, and cyanoethylpullulan.

Preferably employed as a method for forming organic compound films is the aforesaid wet process method.

An inorganic oxide film may be employed together with an organic oxide film via lamination. The thinness of these insulation films is commonly 50 nm to 3 μm, but is preferably 100 nm to −1 μm.

Employed as materials used in a semiconductor layer of the thin film transistor of the present invention include semiconductor materials such as amorphous silicone and poloysilicone, as well as organic semiconductor materials known in the art.

Listed as organic semiconductor materials include:

the above-mentioned π conjugated polymers and oligomers;

acenes such as pentacene;

metal phthalocyanines such as copper phthalocyanine, and fluorine-substituted copper phthalocyanine;

condensed ring tetracarboxylic acid diimides including naphthalene tetracarboxylic acid diimides such as naphthalene-1,4,5,8-tetracarboxylic acid diimide, N,N'-bis(4-trifluoromethylbenzyl)naphthalene-1,4,5,8-tetracarboxylic acid diimide, N,N'-bis(1H,1H-perfluorooctyl), N,N'-bis(1H,1H-perfluorobutyl), or N'-dioctylnaphthalene-1,4,5,8-tetracarbocylic acid diimide derivatives, naphthalene-2,3,6,7-tetracarboxylic acid diimide and anthracene tetracarboxylic acid diimides such as anthracene-2,3,6,7-tetracarboxylic acid;

dyes such as merocyanine dyes or hemicyanine dyes; and organic molecular complexes such as a tetrathiafluvalene (TTF)-tetracyanoquinodimethane (TCNQ) complex, a bisethylenetetrathiafluvalene (BEDTTTE)-perchloric acid complex, a BEDTTTF-iodine complex, or a TCNQ-iodine complex. In addition, employed may be σ conjugated polymers such as polysilane or polygermane, organic-inorganic composite materials described in JP-A No. 2000-260999, fullerenes such as C60 or C70, and carbon nanotubes such as SWNT.

When a polymer is employed as a substrate, it is preferable to use an organic semiconductor material which can be treated at a lower temperature.

In the present invention, a semiconductor layer may be subjected to the aforesaid doping treatment.

Listed as methods for forming the thin film of these semiconductors include: a vacuum evaporation method, a molecular beam epitaxial deposition method, an ion cluster beam method, a low energy ion beam method, an ion plating method, a CVD method, a sputtering method, a plasma polymerization method, an electrolytic polymerization method, a chemical polymerization method, a spray coating method, a spin coating method, a blade coating method, a dip coasting method, a casting method, a roller coating method, a bar coating method, a die coating method, and a LB method, which may be chosen according to the materials. Of these, the coating methods by which a thin film is precisely and easily obtained, for example, a spin coating method, a blade coating method, a dip coating method, a roller coating method, a bar coating method and a die coating method, are preferably used, also, in view of the productivity. The thickness of the thin film of these semiconductors is not specifically limited. However, in many cases, the characteristics of the obtained transistor largely depend on the thickness of the active layer of the organic semiconductors, and the preferable thickness differs depending on the organic semiconductors. The thickness is commonly not more than 1 μm, preferably 10 to 300 nm, but more preferably 20 to 100 nm.

Further, the total film thickness of the thin film transistor of the present invention is not specifically limited, and is preferably in the range of 0.1 to 50 μm, but is more preferably in the range of 0.5 to 10 μm.

EXAMPLES

Figure 4:
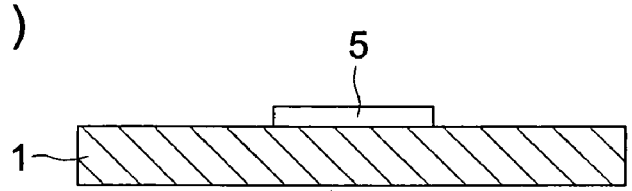
FIG. 4(a) to FIG. 4(e) illustrate one example of the production process of the thin film transistor of the present invention.
Figure 4:
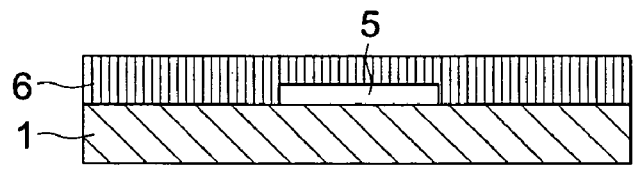
Figure 4:
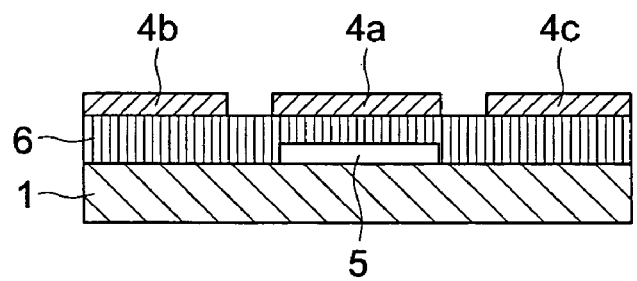
Figure 4:
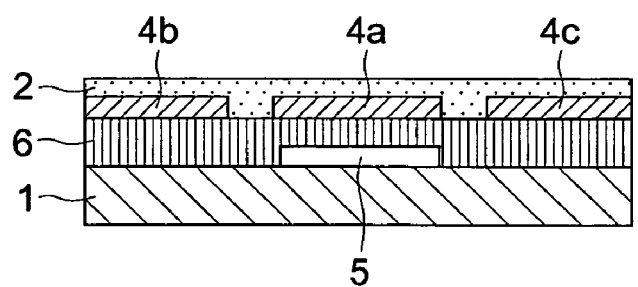
Figure 4:
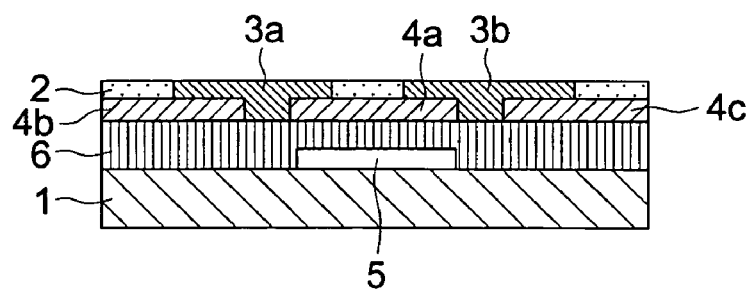

The present invention will be explained using the following examples, however, the present invention is not limited thereto. FIG. 4 will be used for the explanation of the production process of the following thin film transistors.

Example 1

On substrate 1 which was a 200 μm thick PES film, a 200 nm thick aluminum film was deposited employing a sputtering method. Subsequently, the aluminum film was patterned by employing photolithography to form gate electrode 5 (refer to FIG. 4(a)). Further, a 200 nm thick silicon oxide film was formed under the following conditions, employing an atmospheric pressure plasma method to form gate insulator layer 6 (refer to FIG. 4(b)). The film temperature during the formation was maintained at 180° C.

(Used Gas)

Inert gas: helium 98.25 percent by volume

Reactive gas: oxygen gas 1.5 percent by volume

Reactive gas: tetraethoxysilane vapor (bubbled employing helium gas) 0.25 percent by volume (Discharge Condition)

Discharge power: 10 W/cm$^2$

Further, water repellent treatment was performed on a silicon oxide film, employing a plasma method.

Further, on gate insulation layer 6, pentacene, as semiconductor 4a, was formed with a thickness of 50 nm through a mask, utilizing thermal evaporation. Further, source bus line 4b and pixel electrode 4c were formed with a thickness of 1 μm, employing commercially available silver paste via a screen printing method (refer to FIG. 4(c))

Coating liquid composition 1, as described below, was applied so that source bus line 4b, semiconductor layer 4a, and pixel electrode 4c were covered, employing a wire bar and subsequently dried to form a receptive layer of a thickness of 5 μm (refer to FIG. 4(d)). The receptive layer may be applied over the entire surface. However, any coating may be acceptable as long as the coating simultaneously covers source bus line 4b and pixel electrode 4c.

(Coating Liquid Composition 1)

After 0.6 kg of AEROSIL 300 (at a primary particle diameter of 7 nm) produced by Nippon Aerosil Co., Ltd. was suction-dispersed into 3 kg of colloidal silica (at a primary particle diameter of 10-20 nm, 20 percent aqueous dispersion, produced by Nissan Chemical Industries, Ltd.), AEROSIL 300 being fumed silica particles, pure water was added to prepare 7 L of the dispersed liquid. Further, 0.7 L of an aqueous solution containing 27 g of boric acid and 23 g of borax, and 1 g a defoamer (SN381, produced by Sannopco Co.) were added. The resulting mixture was dispersed twice employing a high pressure homogenizer at a pressure of $2.45 \times 10^7$ Pa, whereby an aqueous silica-dispersed liquid was prepared. While stirring at 40° C., 1 L of 5 percent aqueous polyvinyl alcohol solution was added to 1 L of the resulting aqueous silica-dispersed liquid, whereby a receptive layer coating liquid composition was prepared.

Subsequently, an aqueous PEDOT/PSS complex dispersion (produced by Bayer Corp.) as a conductive polymer liquid composition was diluted to twice by water and a non-ionic surface active agent (polyoxyethylene alkyl ether) was added in an amount of 0.05 percent by weight.

Thereafter, source electrode 3a and drain electrode 3b were formed in such a manner that the resulting mixture was ejected employing an ink-jet head of a piezo system, impregnated into receptive layer 2 and then dried, whereby a thin layer transistor was prepared (refer to FIG. 4(e)). The effective channel length and channel width were 20 μm and 200 μm, respectively.

The resulting thin film transistor worked well as a p channel enhancement type FET (Field Effect Transistor), and the mobility of carriers in the saturated region was 0.4 cm2/Vs.

Example 2

A thin film transistor was prepared in the same manner as Example 1, except that a 5 μm thick polyvinyl alcohol (PVA) layer was formed as a receptive layer by employing an aqueous PVA solution. The mobility of carriers in the saturated region was 0.08 $cm^2$/Vs.

Comparative Example

A thin film transistor was prepared in the same manner as Example 1, except that the receptive layer was not formed. The resulting transistor did not work because a short circuit was formed between source electrode 3a and drain electrode 3b.

As described above, when a thin film transistor is produced by forming circuit patterns of source electrode 3a and drain electrode 3b by impregnating a conductive polymer into a receptive layer, the conductive polymer is not accumulated on the surface of the receptive layer but is impregnated and fixed in the receptive layer. Consequently, the spread of the conductive polymer is suppressed and fine and complex patterns of source electrode 3 and drain electrode 3b are successfully formed. Further, even when the surface of receptive layer 2 is damaged due to scratching, the damage to the electrical circuit is only limited, since source electrode 3a and drain electrode 3b are impregnated in the receptive layer. As a result, since it is unnecessary to newly provide a protective layer on the surface of the receptive layer, contrary to the conventional thin film transistors, it is possible to quickly and simply produce a thin film transistor.

EFFECTS OF THE INVENTION

According to the present invention, it is possible to provide: an electrical circuit and a thin film transistor capable of being simply and quickly formed without necessitating processes such as a thermal treatment; a method for producing an electrical circuit which enables simply and quickly forming an electrical circuit having a fine and complex circuit pattern; and a method for producing a thin film transistor.

What is claimed is:

1. A method for manufacturing an electrical circuit comprising a step of forming at least a part of the electrical circuit by impregnating a conductive polymer solution in a solvent or a conductive polymer dispersed liquid in a dispersant, in a receptive layer formed on a substrate, the conductive polymer exhibiting p-type conduction or n-type conduction, wherein the receptive layer contains inorganic particles and the receptive layer is porous.

2. The method for manufacturing the part of the electrical circuit of claim 1, comprising the steps of:
after impregnating the solution or the dispersed liquid containing the conductive polymer in the receptive layer, forming the part of the electrical circuit by evaporating the solvent of the solution containing the conductive polymer or the dispersant of the dispersed liquid containing the conductive polymer.

3. The method for manufacturing the electrical circuit of claim 2, wherein the solvent of the solution containing the conductive polymer or the dispersant of the dispersed liquid containing the conductive polymer contains 30% or more of water.

4. The method for manufacturing the electrical circuit of claim 2, wherein the solvent of the solution containing the conductive polymer or the dispersant of the dispersed liquid containing the conductive polymer contains 5 to 70% by weight of a water soluble organic solvent.

5. The method for manufacturing the electrical circuit of claim 4, wherein the solvent of the solution containing the conductive polymer or the dispersant of the dispersed liquid containing the conductive polymer contains 10 to 30% by weight of a water soluble organic solvent.

6. The method for manufacturing the electrical circuit of claim 2, wherein the solution or the dispersed liquid containing the conductive polymer has 0.001 to 1% by weight of a surfactant.

7. The method for manufacturing the electrical circuit of claim 6, wherein the surfactant is a non-ionic surfactant.

8. The method for manufacturing the electrical circuit of claim 2, wherein the solution or the dispersed liquid containing the conductive polymer is impregnated in the receptive layer by ejecting the solution or the dispersed liquid containing the conductive polymer onto the receptive layer by a ink-jet printing method.

9. The method for manufacturing the electrical circuit of claim 8, wherein an amount of the conductive polymer impregnated in the receptive layer is controlled by controlling an amount of the ejected solution or the dispersed liquid containing the conductive polymer per unit area.

10. The method for manufacturing the electrical circuit of claim 1, wherein the part of the electrical circuit is formed by ejecting the conductive polymer onto the receptive layer by a ink-jet printing method so as to impregnate the ejected conductive polymer in the receptive layer.

11. The method for manufacturing the electrical circuit of claim 10, wherein an amount of the conductive polymer impregnated in the receptive layer is controlled by controlling an amount of the ejected conductive polymer per unit area.

12. The method for manufacturing the electrical circuit of claim 1,
wherein:
the conductive polymer is an oligomer having a repeat number of 4 to 19 or a polymer having a repeat number of 20 or more; and the conductive polymer has a repeat unit of thiophene, vinylene, thienylene vinylene, phenylene vinylene, p-phenylene or a substituent compound thereof.

13. The method for manufacturing the electrical circuit of claim 12, wherein the conductive polymer is an oligomer or a polymer having thiophene or substituted thiophene as a repeat unit.

14. The method for manufacturing the electrical circuit of claim 12, wherein the oligomer or the polymer contains a dopant.

15. The method for manufacturing the electrical circuit of claim 1, wherein an electrical conductivity of the conductive polymer is 0.01 S/cm or more.

16. The method for manufacturing the electrical circuit of claim 15, wherein the electrical conductivity of the conductive polymer is 1 S/cm or more.

17. The method for manufacturing the electrical circuit of claim 1, wherein the inorganic particles are fumed silica particles.

18. The method for manufacturing the electrical circuit of claim 1, wherein an average particle diameter of the inorganic particles is 0.003 to 0.2 µm.

19. The method for manufacturing the electrical circuit of claim 18, wherein the average particle diameter of the inorganic particles is 0.005 to 0.1 µm.

20. The method for manufacturing the electrical circuit of claim 1, wherein:

the receptive layer further contains a hydrophilic binder; and a weight ratio of the inorganic particles to the hydrophilic binder is between 2:1 and 20:1.

21. The method for manufacturing the electrical circuit of claim 1, wherein the substrate is a polymer.

22. A method for manufacturing an electrical circuit comprising a step of forming at least a part of the electrical circuit by impregnating a conductive polymer solution or a conductive polymer dispersed liquid in a receptive layer formed on a substrate, the conductive polymer exhibiting p-type conduction or n-type conduction, wherein the receptive layer is porous; and the receptive layer comprises at least particles selected from the group consisting of alumina particles, pseudo boehmite particles, colloidal silica particles and fumed silica particles.

23. A method for manufacturing an electrical circuit comprising a step of forming at least a part of the electrical circuit by impregnating a conductive polymer solution or a conductive polymer dispersed liquid in a receptive layer formed on a substrate, the conductive polymer exhibiting p-type conduction or n-type conduction, wherein the receptive layer contains inorganic particles and a hydrophilic binder; and a weight ratio of the inorganic particles to the hydrophilic binder is between 2:1 and 20:1.

* * * * *